United States Patent
Amano

(10) Patent No.: US 9,035,390 B2
(45) Date of Patent: May 19, 2015

(54) THIN FILM TRANSISTOR SUBSTRATE AND METHOD FOR PRODUCING SAME

(75) Inventor: Tohru Amano, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/130,849

(22) PCT Filed: Jun. 29, 2012

(86) PCT No.: PCT/JP2012/004224
§ 371 (c)(1),
(2), (4) Date: Jan. 3, 2014

(87) PCT Pub. No.: WO2013/008403
PCT Pub. Date: Jan. 17, 2013

(65) Prior Publication Data
US 2014/0145184 A1 May 29, 2014

(30) Foreign Application Priority Data
Jul. 8, 2011 (JP) .................................. 2011-151657

(51) Int. Cl.
H01L 29/45 (2006.01)
H01L 29/786 (2006.01)
H01L 21/71 (2006.01)
H01L 29/49 (2006.01)
H01L 21/28 (2006.01)
H01L 29/66 (2006.01)

(52) U.S. Cl.
CPC ...... *H01L 29/4966* (2013.01); *H01L 21/28008* (2013.01); *H01L 29/4908* (2013.01); *H01L 29/78609* (2013.01); *H01L 29/7869* (2013.01); *H01L 29/78693* (2013.01); *H01L 29/66969* (2013.01); *H01L 29/45* (2013.01); *H01L 29/78636* (2013.01)

(58) Field of Classification Search
None
See application file for complete search history.

(56) References Cited

U.S. PATENT DOCUMENTS

| | | | |
|---|---|---|---|
| 6,506,664 B1 * | 1/2003 | Beyne et al. | 438/455 |
| 8,178,973 B2 * | 5/2012 | Han et al. | 257/751 |
| 2003/0107023 A1 * | 6/2003 | Chae et al. | 252/79.1 |
| 2006/0178007 A1 | 8/2006 | Nakamura et al. | |

(Continued)

FOREIGN PATENT DOCUMENTS

| | | |
|---|---|---|
| JP | 2001-066634 A | 3/2001 |
| JP | 2006-245558 A | 9/2006 |

(Continued)

OTHER PUBLICATIONS

International Preliminary Report on Patentability Jan. 14, 2014.*

(Continued)

*Primary Examiner* — Joseph Schoenholtz
(74) *Attorney, Agent, or Firm* — Chen Yoshimura LLP

(57) ABSTRACT

A thin film transistor substrate is equipped with: an insulating substrate (10a); a gate electrode (2) constituted by a stack of a first barrier metal layer (3) formed of titanium and disposed over the insulating substrate (10a), a first copper layer (4) disposed over the first barrier metal layer (3), and a second barrier metal layer (5) formed of titanium and disposed over the first copper layer (4); a gate insulating layer (7) disposed covering the gate electrode (2); and a semiconductor layer (8) disposed over the gate insulating layer (7), and having a channel region (C) disposed overlapping the gate electrode (2).

11 Claims, 9 Drawing Sheets

(56) References Cited

U.S. PATENT DOCUMENTS

| | | | |
|---|---|---|---|
| 2008/0149930 A1* | 6/2008 | Lee et al. | 257/59 |
| 2010/0032667 A1 | 2/2010 | Yamazaki et al. | |
| 2011/0169005 A1* | 7/2011 | Saito et al. | 257/59 |

FOREIGN PATENT DOCUMENTS

| | | | | |
|---|---|---|---|---|
| JP | 2009-200355 A | 9/2009 | | |
| JP | 2010-062546 A | 3/2010 | | |
| WO | WO 2010032386 A1 * | 3/2010 | | H01L 27/12 |

OTHER PUBLICATIONS

Definition of Metal downloaded from URL < http://www.merriam-webster.com/dictionary/metal > on Nov. 4, 2014.*

* cited by examiner (a)

(b)

(c)

(d)

(e)

(a)

(b)

THIN FILM TRANSISTOR SUBSTRATE AND METHOD FOR PRODUCING SAME

TECHNICAL FIELD

The present invention relates to a thin film transistor substrate and a manufacturing method therefor, and in particular, relates to a thin film transistor substrate using a barrier metal and a manufacturing method therefor.

BACKGROUND ART

Thin film transistor substrates used as display device substrates for liquid crystal display devices and the like are provided with thin film transistors (also referred to as "TFTs"), for example, as switching elements for respective pixels, which are the smallest image unit.

Also, in general, thin film transistor substrates include gate electrodes, source electrodes, and drain electrodes that constitute the above-mentioned TFTs, and wiring lines connected to these electrodes, and as a material to form these electrodes and wiring lines, copper, which has a low resistance and low cost, is used.

Here, insulating layers such as an interlayer insulating layer and a gate insulating layer are formed on an insulating substrate such as a glass substrate, and it is known that when forming a copper film included in gate electrodes and the like on the insulating layers, when performing annealing thereafter, the copper from the copper film is dispersed to the insulating layers, which reduces the insulating properties of the insulating layers.

In conventional configurations, in order to prevent such a dispersion of copper, a barrier metal (dispersion prevention layer) is provided between the copper film and the insulating layer so as to prevent the dispersion of copper. For the barrier metal layer, a metal layer that prevents the dispersion of copper and improves adhesion with the insulating layer therebelow, for example, is used, and this metal layer is made of a metal such as tantalum or nickel, for example.

When forming electrodes and wiring lines made of copper, first, the barrier metal layer is formed on the insulating layer provided on the insulating substrate, and on the surface of the barrier metal layer, a copper film is formed by sputtering. Then, by performing resist patterning and wet etching on this copper film by photolithography using a photomask having a prescribed pattern, a copper seed layer is formed on the barrier metal. Next, on the copper seed layer, a thin copper film is formed by electroless plating, and thus, electrodes and wiring lines are formed of copper (refer to Patent Document 1, for example).

RELATED ART DOCUMENT

Patent Document

Patent Document 1: Japanese Patent Application Laid-Open Publication No. 2006-245558

SUMMARY OF THE INVENTION

Problems to be Solved by the Invention

Here, in the thin film transistor substrate disclosed in Patent Document 1, while it is possible to prevent the dispersion of copper into the base insulating layer using the barrier metal layer, it is not possible to prevent the dispersion of copper into the semiconductor layers constituting the TFTs. Thus, in the TFTs, leakage current resulting from the dispersion of copper into the semiconductor layers occurred, and as a result, there were problems such as pixel defects and a decrease in display quality. Also, changes in threshold voltage occurred in the TFTs, which decreased TFT characteristics.

The present invention is made in view of the above-mentioned problems, and an object thereof is to provide a thin film transistor substrate that can prevent the dispersion of copper into the semiconductor layers constituting the TFTs, the thin film transistor substrate having gate electrodes and the like of the TFTs made of copper.

Means for Solving the Problems

In order to achieve the above-mentioned object, a thin film transistor substrate of the present invention includes: an insulating substrate; a gate electrode formed on the insulating substrate and made of a layered member including a first barrier metal layer made of a metal other than copper, a first copper layer provided on the first barrier metal layer, and a second barrier metal layer provided on the first copper layer and made of a metal other than copper; a gate insulating layer to cover the gate electrode; and a semiconductor layer provided on the gate insulating layer and having a channel region overlapping the gate electrode.

According to this configuration, in the gate electrode, the second barrier metal layer made of a metal other than copper is provided on the first copper layer, and thus, it is possible to prevent the dispersion of copper from the gate electrode into the semiconductor layer constituting the thin film transistor. Thus, in the thin film transistor including the semiconductor layer, it is possible to prevent the occurrence of leakage current resulting from the dispersion of copper into the semiconductor layer, and thus, in a display device having the thin film transistor substrate, it is possible to prevent the occurrence of pixel defects and a decrease in display quality. Also, it is possible to prevent changes in threshold voltage in the thin film transistors, and thus, it is possible to prevent a decrease in thin film transistor characteristics.

Also, the first barrier metal layer made of a metal other than copper is provided on the insulating substrate, and thus, it is possible to improve the adhesion between the insulating substrate (a glass substrate, for example) and the gate electrode.

Here, "barrier metal layer" refers to a dispersion prevention layer that is made of a metal having non-dispersion properties and that prevents the dispersion of copper (acts as a barrier).

The thin film transistor substrate of the present invention may further include a source electrode and a drain electrode on the semiconductor layer respectively overlapping the gate electrode and facing each other across the channel region, wherein the source electrode and the drain electrode are each made of a layered member including a third barrier metal layer provided on the semiconductor layer and made of a metal other than copper, a second copper layer provided on the third barrier metal layer, and a fourth barrier metal layer provided on the second copper layer and made of a metal other than copper.

According to this configuration, between the semiconductor layer and the second copper layer, the third barrier metal layer made of a metal other than copper is provided, and thus, it is possible to prevent the dispersion of copper from the source electrode and the drain electrode into the semiconductor layer constituting the thin film transistor. Therefore, in the thin film transistor, it is possible to further prevent the occurrence of leakage current resulting from the dispersion of copper in the semiconductor layer, and in the display device including the thin film transistor substrate, it is possible to further prevent the occurrence of pixel defects and a decrease in display quality. Also, it is possible to further prevent changes in threshold voltage in the thin film transistors, and thus, it is possible to further prevent a decrease in thin film transistor characteristics.

Also, the fourth barrier metal layer made of a metal other than copper is provided on the second copper layer. Therefore, even if the amount of time taken for heat treatment is long in the manufacturing process and the distance of movement (dispersion) of the copper is large, it is possible to prevent the dispersion of copper to the semiconductor layer.

In the thin film transistor substrate of the present invention, it is preferable that the metal other than copper be at least one of a group including titanium (Ti), tantalum (Ta), tantalum nitride (TaN), manganese (Mn), and tungsten (W).

According to this configuration, the first to fourth barrier metal layers can be made of a material having excellent non-dispersion properties.

In the thin film transistor substrate of the present invention, the semiconductor layer may be a silicon-type semiconductor layer.

In the thin film transistor substrate of the present invention, the semiconductor layer may be an oxide semiconductor.

In the thin film transistor substrate of the present invention, it is preferable that the oxide semiconductor layer be made of a metal oxide including at least one of a group including indium (In), gallium (Ga), aluminum (Al), copper (Cu), and zinc (Zn).

According to this configuration, even if the oxide semiconductor layer made of these materials is amorphous, the mobility is high, and thus, it is possible to increase the ON resistance of the switching element.

In the thin film transistor substrate of the present invention, it is preferable that the oxide semiconductor layer be made of indium gallium zinc oxide (IGZO).

According to this configuration, in the thin film transistor, it is possible to have excellent properties such as high mobility and low OFF current.

A method of manufacturing a thin film transistor substrate of the present invention includes at least: forming, on an insulating substrate, a first barrier metal layer made of a metal other than copper; forming a first copper layer on the first barrier metal layer; forming, on the first copper layer, a second barrier metal layer made of a metal other than copper, and thereby forming a gate electrode made of a layered member including the first barrier metal layer, the first copper layer, and the second barrier metal layer; forming a gate insulating layer on the gate electrode; and forming, on the gate insulating layer, a semiconductor layer having a channel region overlapping the gate electrode.

According to this configuration, in the gate electrode, the second barrier metal layer made of a metal other than copper is provided on the first copper layer, and thus, it is possible to prevent the dispersion of copper from the gate electrode into the semiconductor layer constituting the thin film transistor. Thus, in the thin film transistor including the semiconductor layer, it is possible to prevent the occurrence of leakage current resulting from the dispersion of copper into the semiconductor layer, and thus, in a display device having the thin film transistor substrate, it is possible to prevent the occurrence of pixel defects or a decrease in display quality. Also, it is possible to prevent changes in threshold voltage in the thin film transistors, and thus, it is possible to prevent a decrease in thin film transistor characteristics.

Also, the first barrier metal layer made of a metal other than copper is formed on the insulating substrate, and thus, it is possible to improve the adhesion between the insulating substrate (a glass substrate, for example) and the gate electrode.

The method of manufacturing a thin film transistor substrate of the present invention may further include, after the step of forming the first barrier metal layer, forming a planarizing film having a penetrating hole over the first barrier metal layer on the insulating substrate, wherein, in the step of forming the first copper layer, the penetrating hole is filled with deposited copper by electroplating, thereby forming the first copper layer on the first barrier metal layer.

According to this configuration, the first copper layer is formed by electroplating, and thus, it is possible to prevent patterning defects in the gate electrode that would result from forming or etching the copper film.

The method of manufacturing a thin film transistor substrate of the present invention may further include: forming, after the step of forming the semiconductor layer, a third barrier metal layer made of a metal other than copper on the gate insulating layer and the semiconductor layer; forming a second copper layer on the third barrier metal layer; and forming a fourth barrier metal layer made of a metal other than copper on the second copper layer, and thereby forming a source electrode and a gate electrode each made of a layered member including the third barrier metal layer, the second copper layer, and the fourth barrier metal layer, the source electrode and the drain electrode respectively overlapping the gate electrode and facing each other across the channel region.

According to this configuration, the third barrier metal layer made of a metal other than copper is provided between the semiconductor layer and the second copper layer, and thus, it is possible to prevent the dispersion of copper from the source electrode and the drain electrode to the semiconductor layer constituting the thin film transistor. Therefore, in the thin film transistor, it is possible to further prevent the occurrence of leakage current resulting from the dispersion of copper to the semiconductor layer, and in the display device including the thin film transistor substrate, it is possible to further prevent the occurrence of pixel defects and a decrease in display quality. Also, it is possible to further prevent changes in threshold voltage in the thin film transistors, and thus, it is possible to further prevent a decrease in thin film transistor characteristics.

Also, the fourth barrier metal layer made of a metal other than copper is provided on the second copper layer. Therefore, even if the amount of time taken for heat treatment is long in the manufacturing process and the distance of movement (dispersion) of the copper is large, it is possible to prevent the dispersion of copper to the semiconductor layer.

The method of manufacturing a thin film transistor substrate of the present invention may further include, after the step of forming the third barrier metal layer, forming an insulating layer having another penetrating hole over the third barrier metal layer on the gate insulating layer and the channel region of the semiconductor layer, wherein, in the step of forming the first copper layer, the another penetrating hole is filled with deposited copper by electroplating, thereby forming the first copper layer on the first barrier metal layer.

According to this configuration, the second copper layer is formed by electroplating, and thus, it is possible to prevent patterning defects in the source electrode and the drain electrode that would result from forming or etching the copper film.

In the method of manufacturing a thin film transistor substrate of the present invention, it is preferable that the metal other than copper be at least one of a group including titanium (Ti), tantalum (Ta), tantalum nitride (TaN), manganese (Mn), and tungsten (W).

According to this configuration, the first to fourth barrier metal layers can be made of a material having excellent non-dispersion properties.

Effects of the Invention

According to the present invention, it is possible to prevent leakage current resulting from the dispersion of copper into the semiconductor layer, and thus, in a display device having the thin film transistor substrate, it is possible to prevent the occurrence of pixel defects or a decrease in display quality. Also, it is possible to prevent changes in threshold voltage in the thin film transistors, and thus, it is possible to prevent a decrease in thin film transistor characteristics.

DETAILED DESCRIPTION OF EMBODIMENT

Embodiments of the present invention will be described in detail below with reference to drawings. The present invention is not limited to the embodiments below.

Embodiment 1

Figure 1:
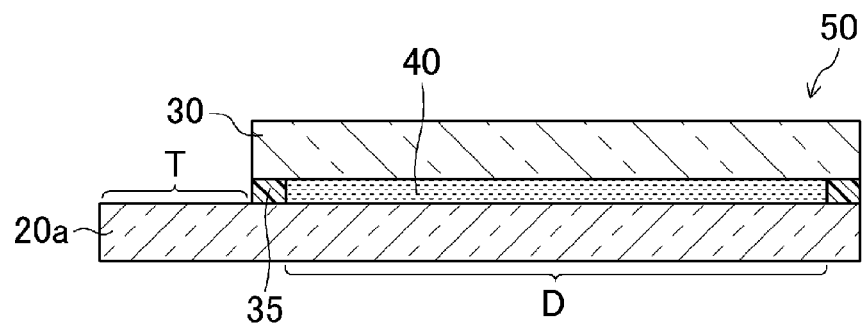
FIG. 1 is a cross-sectional view of a liquid crystal display device including a thin film transistor substrate of Embodiment 1 of the present invention.
Figure 2:
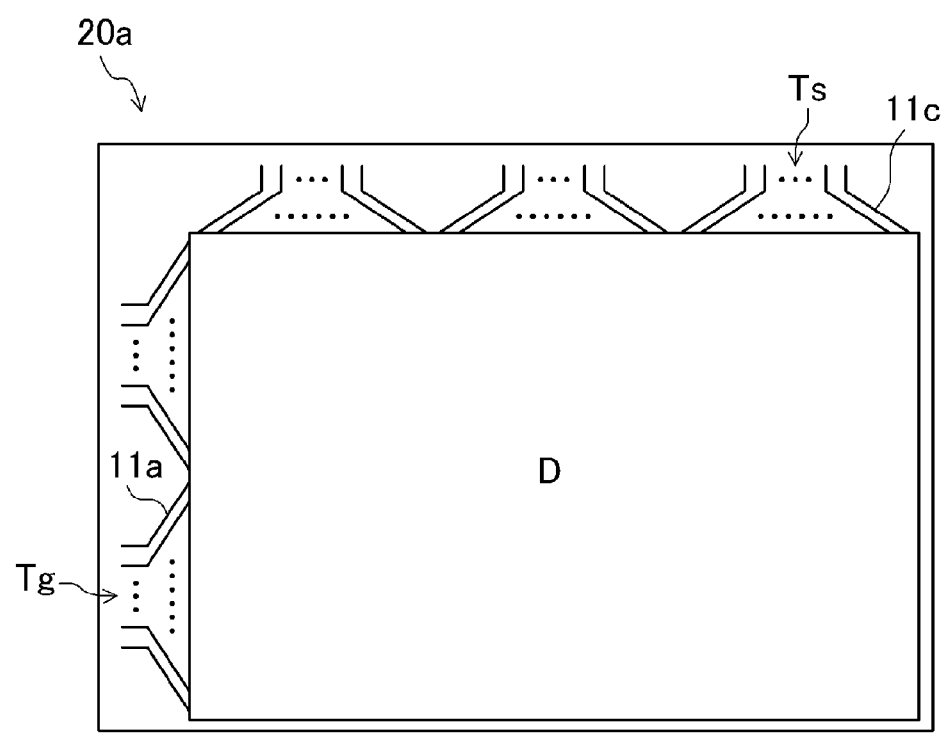
FIG. 2 is a plan view of the thin film transistor substrate of Embodiment 1 of the present invention.
Figure 3:
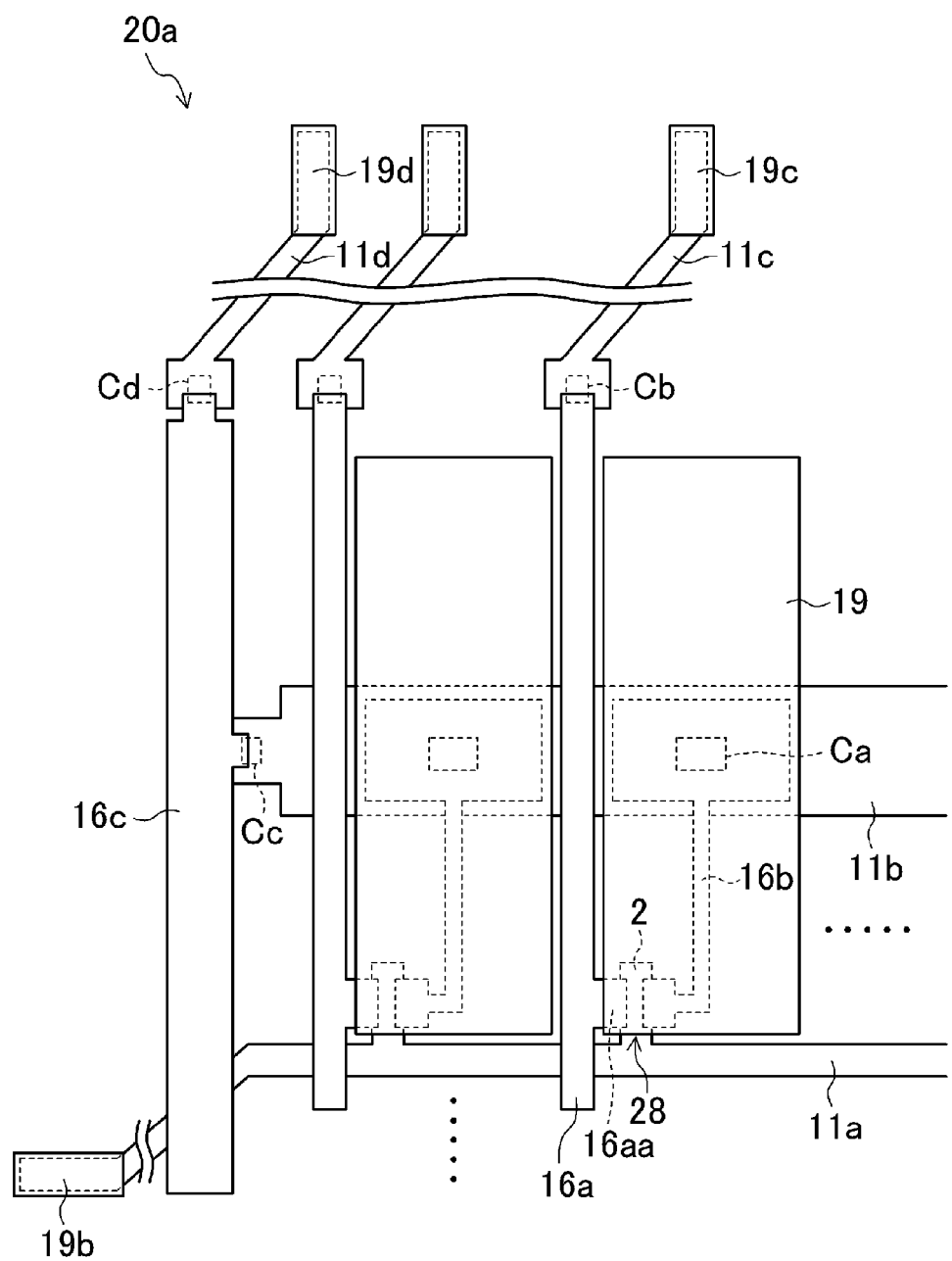
FIG. 3 is a magnified plan view of pixel portions and terminal portions of the thin film transistor substrate of Embodiment 1 of the present invention.

FIG. 1 is a cross-sectional view of a liquid crystal display device including a thin film transistor substrate according to Embodiment 1 of the present invention, and FIG. 2 is a plan view of the thin film transistor substrate according to Embodiment 1 of the present invention. FIG. 3 is a magnified plan view of pixel portions and terminal portions of the thin film transistor substrate of Embodiment 1 of the present invention, and FIG. 4 is a cross-sectional view of a TFT portion of the thin film transistor substrate of Embodiment 1 of the present invention.

As shown in FIG. 1, the liquid crystal display device 50 includes a thin film transistor substrate 20a and an opposite substrate 30 provided so as to face each other, and a liquid crystal layer 40 interposed between the thin film transistor substrate 20a and the opposite substrate 30. The liquid crystal display device 50 also includes a frame-shaped sealing member 35 that bonds together the thin film transistor substrate 20a and the opposite substrate 30, and seals in the liquid crystal layer 40 between the thin film transistor substrate 20a and the opposite substrate 30.

As shown in FIG. 1, in the liquid crystal display device 50, a display region D that performs image display on the inner side of the sealing member 35 is set, and a terminal region T is set in a portion of the thin film transistor substrate 20a that protrudes from the opposite substrate 30.

Figure 4:
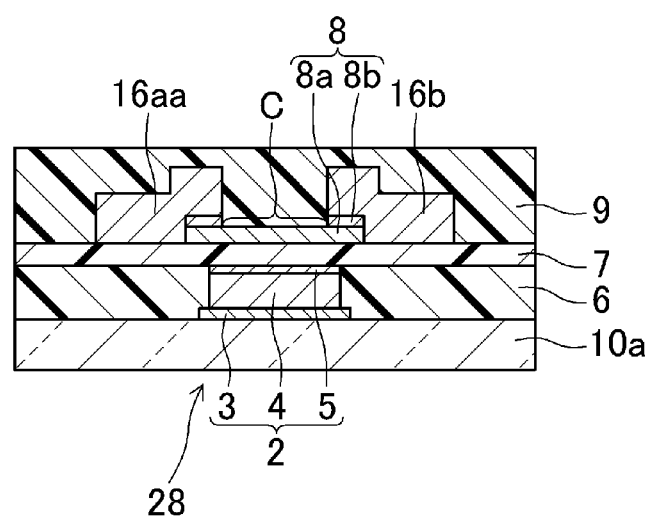
FIG. 4 is a cross-sectional view of a TFT portion of the thin film transistor substrate of Embodiment 1 of the present invention.

As shown in FIGS. 2, 3, and 4, the thin film transistor substrate 20a includes an insulating substrate 10a made of a glass substrate or the like, and, in the display region D, a plurality of scan wiring lines 11a provided so as to extend in parallel with each other on the insulating substrate 10a, and a plurality of auxiliary capacitance wiring lines 11b provided between the respective scan wiring lines 11a and extending in parallel with each other. The thin film transistor substrate 20a includes a plurality of signal wiring lines 16a provided in a direction perpendicular to the scan wiring lines 11a and extending in parallel with each other, a plurality of TFTs 28 provided at each intersection of the scan wiring lines 11a and the signal wiring lines 16a, or in other words, for each pixel, and an interlayer insulating layer 9 provided so as to cover the respective TFTs 28. Additionally, the thin film transistor substrate 20a includes a plurality of pixel electrodes 19 provided in a matrix on the interlayer insulating layer 9 and respectively connected to the TFTs 28, and an alignment film (not shown) covering the respective pixel electrodes 19.

As shown in FIGS. 2 and 3, the scan wiring lines 11a are drawn to a gate terminal region Tg of the terminal region T (refer to FIG. 1), and in the gate terminal region Tg, the scan wiring lines 11a are connected to gate terminals 19b.

As shown in FIG. 3, the auxiliary capacitance wiring lines 11b are connected to auxiliary capacitance terminals 19d through auxiliary capacitance trunk lines 16c and relay wiring lines 11d. Here, the auxiliary capacitance trunk lines 16c are connected to the auxiliary capacitance wiring lines 11b through contact holes Cc formed in the gate insulating layer 7, and are connected to the relay wiring lines 11d through contact holes Cd formed in the gate insulating layer 7.

As shown in FIGS. 2 and 3, the signal wiring lines 16a are drawn to a source terminal region Ts of the terminal region T (refer to FIG. 1) as relay wiring lines 11c, and in the source terminal region Ts, the signal wiring lines 16a are connected to source terminals 19c. Also, as shown in FIG. 3, the signal wiring lines 16a are connected to the relay wiring lines 11c through contact holes Cb formed in the gate insulating layer 7.

As shown in FIGS. 3 and 4, each TFT 28 includes a gate electrode 2 provided on the insulating substrate 10a, a planarizing film 6 provided adjacent to the gate electrode 2 on the insulating substrate 10a, and the gate insulating layer 7 provided so as to cover the gate electrode 2 and the planarizing film 6. Also, each TFT 28 includes a semiconductor layer 8 having a channel region C provided in an island shape so as to overlap the gate electrode 2 on the gate insulating layer 7, and a source electrode 16aa and a drain electrode 16b provided so as to overlap the gate electrode 2 on the semiconductor layer 8 and so as to branch away from each other with the channel region C therebetween.

Here, as shown in FIG. 3, the gate electrode 2 is a portion that protrudes towards the side of the scan wiring line 11a. Also, as shown in FIG. 3, the source electrode 16aa is a portion of each signal wiring line 16a that projects from the side thereof.

The drain electrode 16b is connected to the pixel electrode 19 through the contact hole Ca formed in the interlayer insulating layer 9 provided on the gate insulating layer 7, and forms an auxiliary capacitance by overlapping the auxiliary capacitance wiring line 11b through the gate insulating layer 7.

Also, the semiconductor layer 8 is made of a silicon layer, and is constituted of a lower layer intrinsic amorphous silicon layer 8a, and an n+ amorphous silicon layer (electrode contact layer) 8b thereabove that has been doped with an n-type impurity (phosphorus, for example), for example.

As shown in FIG. 7(c) to be described below, the opposite substrate 30 includes the insulating substrate 10b, a black matrix 21 provided in a grid shape on the insulating substrate 10b, and color filter layers having colored layers 22 including red layers, green layers, blue layers, and the like, each of which is provided in respective cells of the grid-shaped black matrix 21. The opposite substrate 30 includes a common electrode 23 provided so as to cover the color filter layers, photospacers 24 provided on the common electrode 23, and an alignment film (not shown) provided so as to cover the common electrode 23.

The liquid crystal layer 40 is made of a nematic liquid crystal material or the like that has electrooptic characteristics.

In the liquid crystal display device 50 configured as described above, in each pixel, a gate signal is sent from a gate driver (not shown) to the gate electrode 2 through the scan wiring line 11a, thereby turning ON the TFT 28, and in that state, a source signal is sent from a source driver (not shown) to the source electrode 16aa through the signal wiring line 16a, and a prescribed charge is written to the pixel electrode 19 through the semiconductor layer 8 and the drain electrode 16b.

At this time, a difference in potential occurs between the respective pixel electrodes 19 of the thin film transistor substrate 20a and the common electrode 23 of the opposite substrate 30, and a prescribed voltage is applied to the liquid crystal layer 40, or in other words, the liquid crystal capacitance of the respective pixels and to the auxiliary capacitance connected in parallel with the liquid crystal capacitance.

In each pixel in the liquid crystal display device 50, the orientation state of the liquid crystal layer 40 changes depending on the voltage applied to the liquid crystal layer 40, thereby adjusting the light transmittance of the liquid crystal layer 40 to display an image.

Here, in the present embodiment, as shown in FIG. 4, the gate electrode 2 is characterized by being constituted of a layered member including a first barrier metal layer 3 provided on the insulating substrate 10a and made of a metal other than copper (titanium, for example), a first copper layer 4 provided on the first barrier metal layer 3, and a second barrier metal layer 5 provided on the first copper layer 4 and made of a metal other than copper (titanium, for example).

In the present embodiment, the second barrier metal layer 5 made of a metal other than copper is provided on the first copper layer 4, and thus, it is possible to prevent the dispersion of copper from the gate electrode 2 to the semiconductor layer 8 constituting the TFT 28. Therefore, in the TFT 28, it is possible to prevent the occurrence of leakage current resulting from the dispersion of copper in the semiconductor layer 8, and in the liquid crystal display device 50, it is possible to prevent the occurrence of pixel defects and a decrease in display quality. Also, it is possible to prevent a change in threshold voltage in the TFT 28, and thus, it is possible to prevent a decrease in TFT characteristics.

Examples of a metal that can be suitably used for the first and second barrier metal layers 3 and 5 include titanium (Ti), tantalum (Ta), tantalum nitride (TaN), manganese (Mn), and tungsten (W), which have non-dispersion properties and can be removed (lifted off) along with the photoresist.

Also, because the first barrier metal layer 3 made of a metal other than copper is provided on the insulating substrate 10a such as a glass substrate, it is possible to improve the adhesion between the insulating substrate 10a and the gate electrode 2.

Figure 5:
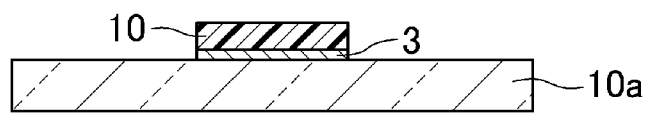
FIG. 5 includes descriptive drawings of cross-sections of manufacturing steps for the thin film transistor substrate of Embodiment 1 of the present invention.
Figure 5:
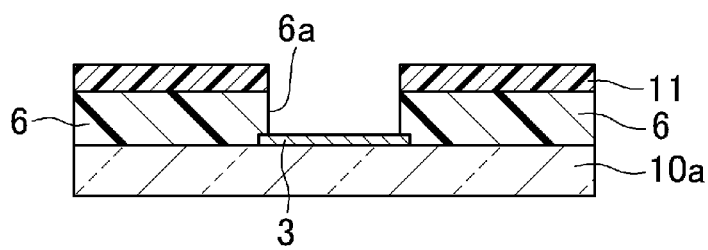
Figure 5:
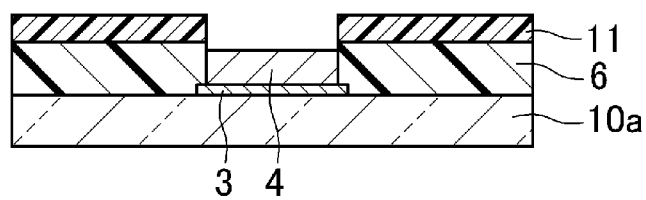
Figure 5:
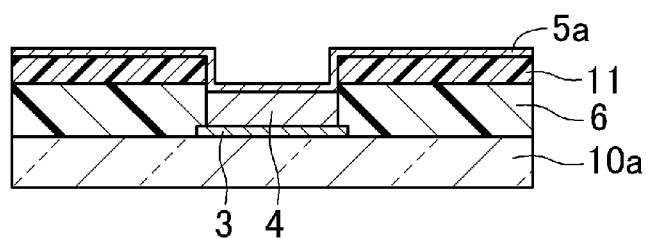
Figure 5:
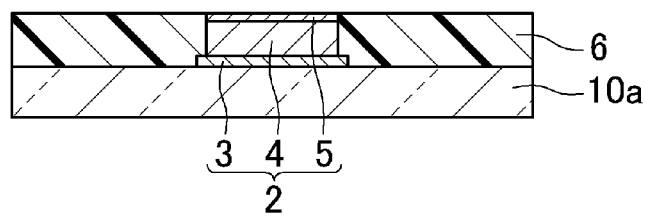
Figure 6:
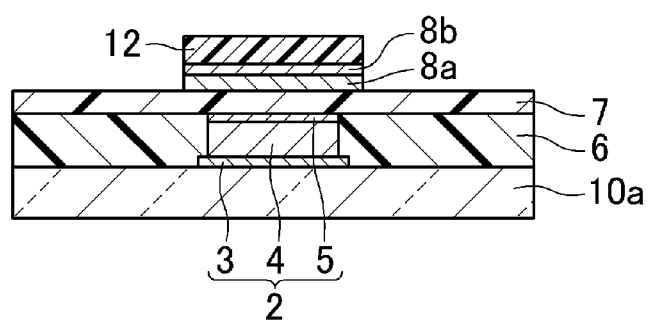
FIG. 6 includes descriptive drawings of cross-sections of manufacturing steps for the thin film transistor substrate of Embodiment 1 of the present invention.
Figure 6:
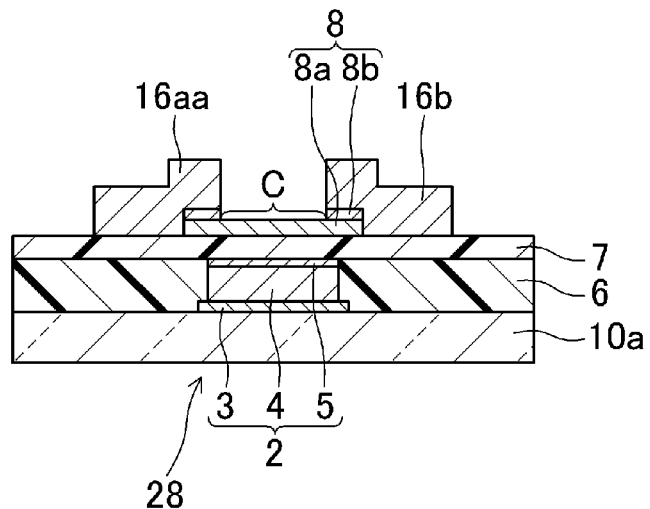
Figure 7:
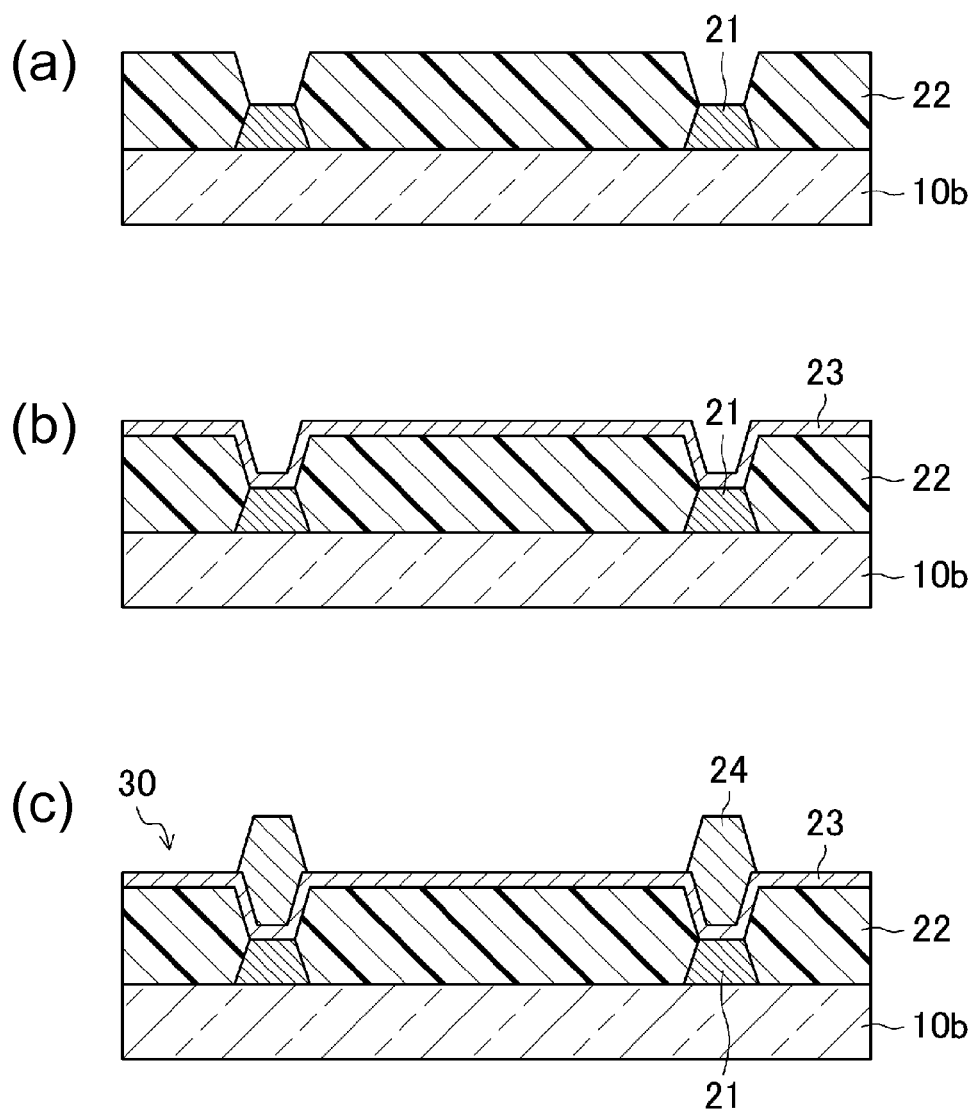
FIG. 7 includes descriptive drawings of cross-sections of manufacturing steps for an opposite substrate of Embodiment 1 of the present invention.

Next an example of a manufacturing method for the liquid crystal display device 50 of the present embodiment will be described with reference to FIGS. 5 to 7. FIGS. 5 and 6 are descriptive drawings showing cross-sections of manufacturing steps for the thin film transistor substrate of Embodiment 1 of the present invention, and FIG. 7 includes descriptive drawings showing cross-sections of manufacturing steps for the opposite substrate according to Embodiment 1 of the present invention. The manufacturing method of the present embodiment includes the process of making the TFTs and the thin film transistor substrate, the process of making the opposite substrate, and the process of injecting liquid crystal.

First, the process of making the TFTs and the thin film transistor substrate will be described.

<Step of Forming First Barrier Metal Layer>

First, on the entire substrate of the insulating substrate 10a such as a glass substrate, a titanium film (300 to 400 Å in thickness) for the first barrier metal layer 3 is formed, for example, by sputtering. Then, on the titanium film, a resist (a positive resist, for example) 10 that has been patterned by photolithography using a photomask having a prescribed pattern is provided. Then, by wet etching the titanium film, as shown in FIG. 5(a), the first barrier metal layer 3 that has been patterned is formed on the insulating substrate 10a.

<Step of Forming Planarizing Film>

Next, after removal and washing of the resist 10, a silicon nitride film (approximately 3500 to 4000 Å in thickness) is formed, for example, by CVD on the insulating substrate 10a upon which the first barrier metal layer 3 has been formed. Then, on the silicon nitride film, a resist (a negative resist, for example) 11 that has been patterned by photolithography using the above-mentioned photomask is provided. Then, by wet etching the silicon nitride film, as shown in FIG. 5(b), the patterned planarizing film 6 is formed on the insulating substrate 10a. As shown in FIG. 5(b), the patterned planarizing film 6 has a penetrating hole 6a over the first barrier metal layer 3.

<Step of Forming Copper Layer>

Next, the first copper layer 4 is formed by electroplating. More specifically, first, on one surface of the insulating substrate 10a including the planarizing film 6 with the penetrating hole 6a formed therethrough, copper foil is attached, and using a prescribed jig, the copper foil is held in place, for example.

Next, inside the electroplating device having a plating bath (a copper sulfate bath, for example), the insulating substrate 10a to which the copper foil is attached is set. Then, using the copper foil as the supply electrode (negative pole) for electroplating, a current is passed between the supply electrode and a positive pole separately disposed in the plating bath, thus causing the metal (in other words, copper) to undergo a reduction reaction on the negative pole, and thereby filling the penetrating hole 6a with the deposited metal (in other words, copper), and thus, as shown in FIG. 5(c), the first copper layer 4 is formed in the penetrating hole 6a (in other words, on the first barrier metal layer 3). After forming the first copper layer 4, the hold by the jig is removed, and the copper foil is thus removed from the insulating substrate 10a.

As a plating bath, besides the copper sulfate bath described above, a copper cyanide bath or a copper pyrophosphate bath can be used, for example. Also, at this time, the scan wiring lines 11a, the auxiliary capacitance wiring lines 11b, and the relay wiring lines 11c and 11d shown in FIG. 3 are simultaneously formed.

Here, in a conventional technique, as described above, a copper film is formed by sputtering onto the surface of the dispersion prevention layer, and by patterning and wet etching the copper film using resist by photolithography using a photomask, the copper seed layer is formed on the dispersion prevention layer. However, after a prescribed amount of time has passed after the copper film has been formed, an oxide film forms on the surface of the copper, which reduces the adhesion between the copper film and the resist, and when etching, the etching solution seeps onto the copper film, and as a result, there was a problem of patterning defects in the electrodes and wiring lines made of copper.

Also, if the adhesion between the copper film and the resist is reduced, then if the etching solution has a change in concentration due to the resulting deterioration of the etching solution, for example, this results in a change in etching rate, thus resulting in over-etching or under-etching. As a result, there was a problem of patterning defects in the electrodes and wiring lines made of copper.

On the other hand, in the present embodiment, as described above, the first copper layer 4 is formed by electroplating, and thus, unlike the conventional technique, there is no need for forming the copper film or etching, and as a result, it is possible to prevent patterning defects in the gate electrode 2.

In the above-mentioned conventional technology, as described above, the thin copper film is formed by electroless plating. However, electroplating has the advantage of greater ease in managing the plating bath due to the fact that compared to electroless plating, the composition of the plating bath is simpler and the plating bath is less affected by pH and temperature.

<Step of Forming Second Barrier Metal Layer>

Next, as shown in FIG. 5(d), a titanium film (300 to 400 Å in thickness) 5a for use in the second barrier metal layer 5, for example, is formed by sputtering on the first copper layer 4 and the resist 11. By removing and washing the resist 11 using a solvent (an amine-type removal fluid such as hydroxylamine, for example), the resist 11 and the titanium film 5a formed on the resist 11 are removed (lifted off), thus forming the second barrier metal layer 5 made of the titanium film 5a onto the first copper layer 4. As a result, as shown in FIG. 5(e), on the insulating substrate 10a, the gate electrode 2 constituted of a layered member including the first barrier metal layer 3, the first copper layer 4, and the second barrier metal layer 5 is formed.

In this manner, in the present embodiment, when forming the second barrier metal layer 5, there is no need to perform patterning by etching on the titanium film 5a, and thus, it is possible to simplify the manufacturing process.

Also, in this case, the scan wiring lines 11a, the auxiliary capacitance wiring lines 11b, and the relay wiring lines 11c and 11d shown in FIG. 3 are simultaneously formed.

<Step of Forming Gate Insulating Layer>

Next, on the surface of the gate electrode 2 and the planarizing film 6, a silicon nitride film (2000 to 2200 Å in thickness), for example, is formed by CVD, and as shown in FIG. 6(a), the gate insulating layer 7 is formed so as to cover the gate electrode 2 and the planarizing film 6.

The gate insulating layer 7 may have a two-layered structure. In this case, besides the above-mentioned silicon nitride film ($SiN_X$), a silicon oxide film ($SiO_X$), a silicon nitride oxide film ($SiO_XN_Y$, where x>y), a silicon oxide nitride film ($SiN_XO_Y$, where x>y), or the like may be used, for example.

From the perspective of preventing the dispersion of impurities and the like from the insulating substrate 10a, it is preferable that the gate insulating layer on the lower layer side be made of a silicon nitride film or a silicon oxide nitride film, and that the gate insulating layer on the upper side be made of a silicon oxide film or a silicon nitride oxide film. For example, it is possible to form a silicon nitride film having a thickness of 100 nm to 200 nm as the lower layer side gate insulating layer using $SiH_4$ and $NH_3$ as the reactant gases, and it is possible to form a silicon oxide film having a thickness of 50 nm to 100 nm as the upper layer side gate insulating layer with $N_2O$ and $SiH_4$ as the reactant gases.

Also, from the perspective of forming a precise gate insulating layer 7 with a low gate leakage current at a low film-forming temperature, it is preferable that a noble gas such as argon be included in the reactant gas and mixed into the insulating layer.

<Step of Forming Semiconductor Layer and Source and Drain>

Next, by plasma CVD, on the entire substrate upon which the gate insulating layer 7 is formed, an intrinsic amorphous silicon film (1900 to 2300 Å in thickness), and an $n^+$ amorphous silicon film (300 to 400 Å in thickness) doped with phosphorus are formed consecutively, for example.

When forming the silicon nitride film in the step of forming the gate insulating layer, the silicon nitride film, the intrinsic amorphous silicon layer, and the $n^+$ amorphous silicon layer may be formed consecutively.

Then, by patterning and dry etching the resist 12 by photolithography using a photomask having a prescribed pattern, as shown in FIG. 6(a), a semiconductor-forming layer in which the intrinsic amorphous silicon layer 8a and the $n^+$ amorphous silicon layer 8b are layered is formed so as to be patterned in an island shape on the gate electrode 2.

Next, the resist 12 is removed and washed, and an aluminum film, a titanium film, and the like are layered in that order, for example, by sputtering on the entire substrate upon which the semiconductor-forming layer is formed. Next, by performing patterning by photolithography, a signal wiring line 16a, a source electrode 16aa, and a drain electrode 16b are formed to a thickness of approximately 3500 to 4000 Å.

Then, by etching the $n^+$ amorphous silicon layer 8b of the semiconductor-forming layer using the source electrode 16aa and the drain electrode 16b as masks, as shown in FIG. 6(b), a channel region C is patterned, and a semiconductor layer 8 and a TFT 28 provided therewith are formed.

<Step of Forming Interlayer Insulating Layer>

Next, on the entire substrate upon which the source electrode 16aa and the drain electrode 16b are formed (in other words, where the TFT 28 is formed), a silicon nitride film (approximately 3000 to 3500 Å in thickness), for example, is formed by CVD. Then, by performing patterning, exposure and developing, and removal and washing of the resist by photolithography using a photomask with a prescribed pattern on the silicon nitride film, as shown in FIG. 4, an interlayer insulating layer 9 covering the TFT 28 (in other words, covering the semiconductor layer 8, the source electrode 16aa, and the drain electrode 16b) is formed. The patterned interlayer insulating layer 9 has formed therein the contact hole Ca mentioned above.

<Step of Forming Pixel Electrode>

Lastly, a transparent conductive film such as an ITO film (approximately 50 nm to 200 nm in thickness) made of indium tin oxide is formed, for example, by sputtering onto the entire substrate upon which the interlayer insulating layer 9 is formed.

Then, by performing patterning, exposure and developing, and removal and washing of resist by photolithography using a photomask having a prescribed pattern on the transparent conductive film, pixel electrodes 19, gate terminals 19b, source terminals 19c, and auxiliary capacitance terminals 19d (refer to FIG. 3) are formed.

In this manner, it is possible to form the thin film transistor substrate 20a shown in FIGS. 2 and 3.

<Process of Making Opposite Substrate>

First, after coating the entire insulating substrate 10b such as a glass substrate with a photosensitive resin dyed black, for example, by spin coating or slit coating, the coated film is exposed and developed, thereby forming a black matrix 21 with a thickness of approximately 1.0 µm as shown in FIG. 7(a).

Next, on the entire substrate upon which the black matrix 21 is formed, a photosensitive resin dyed red, green, or blue is coated, for example, by spin coating or slit coating, and then, the coated film is exposed and developed, thereby forming colored layers 22 of a selected color (red layer, for example) to a thickness of approximately 2.0 µm, as shown in FIG. 7(a). Then, repeating a similar step for the other two colors, colored layers 22 of the other two colors (green layer and blue layer, for example) are formed to a thickness of approximately 2.0 µm.

Then, on the substrate upon which the colored layers 22 of the respective colors are formed, a transparent conductive film such as an ITO film is deposited by sputtering, for example, and thus, as shown in FIG. 7(b), the common electrode 23 is formed to a thickness of approximately 50 nm to 200 nm.

Lastly, on the entire substrate upon which the common electrode 23 is formed, a photosensitive resin is coated thereon by spin coating or slit coating, and then, the coated film is exposed and developed, thereby forming photospacers 24 to a thickness of approximately 4 µm as shown in FIG. 7(c).

In this manner, the opposite substrate 30 can be made.

<Step of Dripping Liquid Crystal>

First, on the respective surfaces of the thin film transistor substrate 20a made in the process of making the thin film transistor substrate and the opposite substrate 30 made in the process of making the opposite substrate, polyimide resin films are coated thereon by printing, and then these coated films are subjected to baking and rubbing treatment, thereby forming alignment films.

Then, on the surface of the opposite substrate 30 upon which the alignment film is formed, for example, a sealing member made of resin that is both UV (ultraviolet) curable and heat curable, or the like is printed in a frame shape, and then, on the inner side of the sealing member, a liquid crystal material is dripped.

Further, after the opposite substrate 30 into which the liquid crystal material is dripped and the thin film transistor substrate 20a upon which the alignment film is formed are bonded together in a depressurized state, the bonded member is released to atmospheric pressure, thereby pressurizing the front surface and rear surface of the bonded member.

Then, after the sealing member sandwiched between the substrates of the bonded member is irradiated with UV light, the bonded member is heated, thereby curing the seal.

Lastly, by dicing the bonded member in which the sealing member has been cured, for example, unnecessary portions are removed.

In this manner, it is possible to manufacture the liquid crystal display device 50 of the present embodiment.

According to the present embodiment described above, the following effects can be attained.

(1) In the present embodiment, the gate electrode 2 has a configuration in which the second barrier metal layer 5 made of a metal other than copper is formed on the first copper layer 4. Thus, it is possible to prevent the dispersion of copper to the semiconductor layer 8 constituting the TFT 28. As a result, in the TFT 28, it is possible to prevent the occurrence of leakage current that would result from a dispersion of copper to the semiconductor layer 8 from the gate electrode 2, and thus, in the liquid crystal display device 50 including the thin film transistor substrate 20a, it is possible prevent the occurrence of pixel defects and a decrease in display quality. Also, it is possible to prevent a change in threshold voltage in the TFTs 28, and thus, it is possible to prevent a decrease in TFT characteristics.

(2) In the present embodiment, the first barrier metal layer 3 made of a metal other than copper is provided on the insulating substrate 10a. Thus, it is possible to improve the adhesion between the insulating substrate (a glass substrate, for example) 10a and the gate electrodes 2.

(3) In the present embodiment, titanium (Ti), tantalum (Ta), tantalum nitride (TaN), manganese (Mn), tungsten (W), or the like are used as the metal other than copper by which the first and second barrier metal layers 3 and 5 are formed. Therefore, it is possible to make the first and second barrier metal layers 3 and 5 of a material having excellent non-dispersion qualities.

(4) In the present embodiment, in the step of forming the first copper layer, copper is deposited and filled into penetrating holes 6a using electroplating, and thus, the first copper layer 4 is formed on the first barrier metal layer 3. Therefore, it is possible to prevent patterning defects in the gate electrodes 2 that would result from forming the copper film or etching.

Embodiment 2

Figure 8:
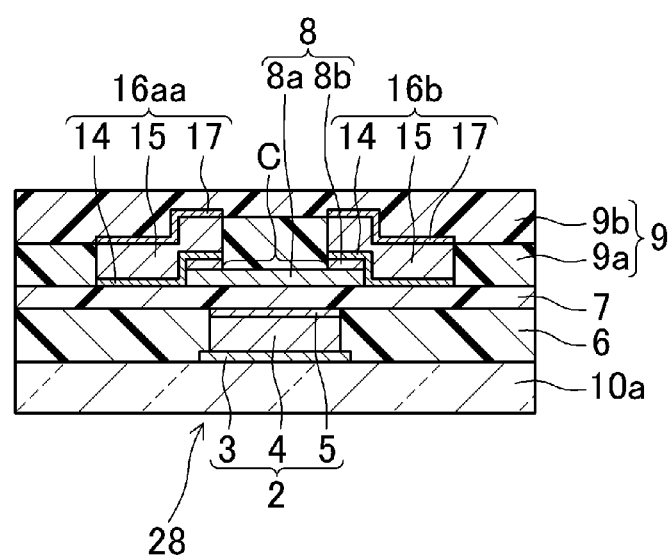
FIG. 8 is a cross-sectional view of a TFT portion of the thin film transistor substrate of Embodiment 2 of the present invention.

Next, Embodiment 2 of the present invention will be described. FIG. 8 is a cross-sectional view of a TFT portion of a thin film transistor substrate according to Embodiment 2 of the present invention.

In the present embodiment, constituent portions similar to those of Embodiment 1 are assigned the same reference characters and descriptions thereof are omitted. Also, the configuration of the entire liquid crystal display device and thin film transistor substrate is similar to what was described in Embodiment 1 above, and thus, detailed descriptions thereof are omitted here.

The present embodiment is characterized in that the source electrode 16aa and the drain electrode 16b are made of layered members including a copper layer and barrier metal layers, as in the gate electrode 2 described above.

More specifically, as shown in FIG. 8, the source electrode 16aa and the drain electrode 16b are provided on the gate insulating layer 7 and on the semiconductor layer 8, and are characterized in having a layered member constituted of a third barrier metal layer 14 made of a metal other than copper (titanium, for example) provided on the gate insulating layer 7 and the semiconductor layer 8, a second copper layer 15 provided on the third barrier metal layer 14, and a fourth barrier metal layer 17 made of a metal other than copper (titanium, for example) provided on the second copper layer 15.

In the present embodiment, due to the third barrier metal layer 14 made of a metal other than copper being provided between the semiconductor layer 8 and the second copper layer 15, it is possible to prevent the dispersion of copper to the semiconductor layer 8 constituting the TFT 28 from the source electrode 16aa and the drain electrode 16b. Therefore, in the TFT 28, it is possible to further prevent the occurrence of leakage current resulting from the dispersion of copper to the semiconductor layer 8, and in the liquid crystal display device 50, it is possible to further prevent the occurrence of pixel defects and a decrease in display quality. Also, it is possible to further prevent a change in threshold voltage in the TFTs 28, and thus, it is possible to further prevent a decrease in TFT characteristics.

Because the fourth barrier metal layer 17 made of a metal other than copper is provided on the second copper layer 15, even if the amount of time taken for heat treatment in the manufacturing process (time taken for heat treatment in CVD, for example) becomes long and the distance of movement (dispersion) of the copper becomes great (represented by $D^{0.5} \times t$, where the heat treatment time is "t," and where the thermal diffusion coefficient of copper is "D"), it is possible to prevent the dispersion of copper to the semiconductor layer 8 through the interlayer insulating layer 9.

The metal by which the third and fourth barrier metal layers 14 and 17 are formed has non-dispersion properties and can be suitably removed (lifted off) along with the photoresist, as in the first and second barrier metal layers 3 and 5 mentioned above, and examples thereof include titanium (Ti), tantalum (Ta), tantalum nitride (TaN), manganese (Mn), and tungsten (W).

In the present embodiment, as shown in FIG. 8, the interlayer insulating layer 9 includes a first interlayer insulating layer 9a provided so as to cover the channel region C of the gate insulating layer 7 and the semiconductor layer 8, and a second interlayer insulating layer 9b provided so as to cover the first interlayer insulating layer 9a, the source electrode 16aa, and the drain electrode 16b.

Figure 9:
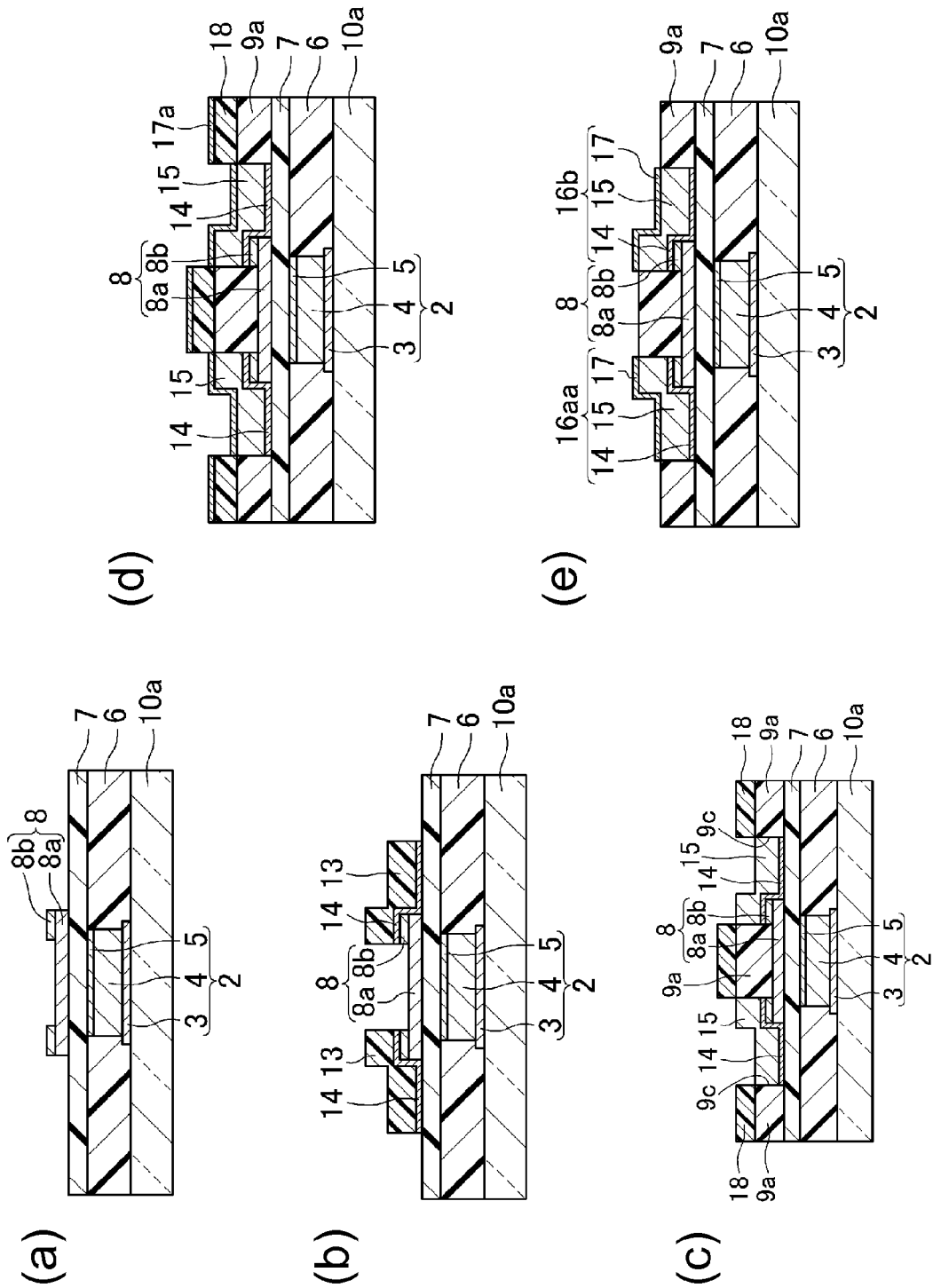
FIG. 9 includes descriptive drawings of cross-sections of manufacturing steps for the thin film transistor substrate of Embodiment 2 of the present invention.

Next, a manufacturing method for the liquid crystal display device 50 of the present embodiment will be described. FIG. 9 includes descriptive drawings of cross-sections of manufacturing steps for the thin film transistor substrate of Embodiment 2 of the present invention. The process of making the opposite substrate and the step of dripping liquid crystal are similar to those described in Embodiment 1 above, and therefore, detailed descriptions thereof will be omitted here.

First, as in FIG. 5 of Embodiment 1 above, the gate electrode 2 constituted of a layered member including the first barrier metal layer 3, the first copper layer 4, and the second barrier metal layer 5, and the planarizing film 6 are formed on the insulating substrate 10a.

Next, similar to FIG. 6(a) of Embodiment 1 above, a semiconductor forming layer in which the gate insulating layer 7, and the intrinsic amorphous silicon layer 8a and $n^+$ amorphous silicon layer 8b are layered is formed.

Next, removal and washing of the resist 12 is performed, and by patterning the resist, dry etching, and removing and washing the resist by photolithography using a photomask having a prescribed pattern for the semiconductor forming layer, as shown in FIG. 9(a), the semiconductor layer 8 is patterned.

<Step of Forming Third Barrier Metal Layer>

First, a titanium film (300 to 400 Å in thickness) for the third barrier metal layer 14 is formed, for example, by sputtering on the gate insulating layer 7 and the semiconductor layer 8. Then, a resist (positive resist, for example) 13 that has been patterned by photolithography using a photomask having a prescribed pattern is provided on the titanium film, and by wet etching this titanium film, as shown in FIG. 9(b), the patterned third barrier metal layer 14 is formed on the gate insulating layer 7 and the semiconductor layer 8.

<Process of Forming First Interlayer Insulating Film>

Next, after removal and washing of the resist 13, a silicon nitride film (approximately 3500 to 4000 Å in thickness) is formed, for example, by CVD on the gate insulating layer 7 upon which the semiconductor layer 8 and the third barrier metal layer 14 have been formed. Then, on the silicon nitride film, a resist (a negative resist, for example) 18 that has been patterned by photolithography using the photomask used in the above-mentioned step of forming the third barrier metal layer is provided. Then, by wet etching the silicon nitride film, as shown in FIG. 9(c), the patterned first interlayer insulating layer 9a is formed on the gate insulating layer 7 and the semiconductor layer 8 (channel region C of the semiconductor layer 8). As shown in FIG. 9(c), the patterned first interlayer insulating layer 9a has a penetrating hole 9c over the third barrier metal layer 14.

<Step of Forming Copper Layer>

Next, the second copper layer 15 is formed by electroplating. More specifically, first, on one surface of the insulating substrate 10a including the first interlayer insulating layer 9a with the penetrating hole 9c formed therethrough, copper foil is attached, and using a prescribed jig, the copper foil is held in place, for example.

Next, inside the electroplating device having a plating bath (a copper sulfate bath, for example), the insulating substrate 10a to which the copper foil is attached is set. Then, using the copper foil as the supply electrode (negative pole) for electroplating, a current is passed between the supply electrode and a positive pole separately disposed in the plating bath, thus causing the metal (in other words, copper) to undergo a reduction reaction on the negative pole, and thereby filling the penetrating hole 9c with the deposited metal (in other words, copper), and thus, as shown in FIG. 9(c), the second copper layer 15 is formed in the penetrating hole 9c. After forming the second copper layer 15, the hold by the jig is removed, and the copper foil is thus removed from the insulating substrate 10a.

Even in this case, as in Embodiment 1 mentioned above, besides the copper sulfate bath described above, a copper cyanide bath or a copper pyrophosphate bath can be used, for example, as the plating bath.

Also, similar to the step of forming the first copper layer 4, the second copper layer 15 is formed by electroplating, and thus, unlike conventional techniques, there is no need to form or etch a copper film, and patterning defects in the source electrode 16aa and the drain electrode 16b can be prevented.

<Step of Forming Fourth Barrier Metal Layer>

Next, as shown in FIG. 9(d), a titanium film (300 to 400 Å in thickness) 17a for use in the fourth barrier metal layer 17, for example, is formed by sputtering on the second copper layer 15 and the resist 18. Then, using a solvent (an amine-type removal fluid such as hydroxylamine, for example), the resist 18 is removed and washed, and thus, the resist 18 and the titanium film 17a formed on the resist 18 are removed (lifted off), and as shown in FIG. 9(e), the fourth barrier metal layer 17 made of the titanium film 17a is formed on the second copper layer 15. As a result, the source electrode 16aa and the drain electrode 16b constituted of a layered member including the third barrier metal layer 14, the second copper layer 15, and the fourth barrier metal layer 17 are formed on the gate insulating layer 7 and the semiconductor layer 8.

In this manner, in the present embodiment, when forming the fourth barrier metal layer 17, there is no need to perform patterning by etching on the titanium film 17a, and thus, it is possible to simplify the manufacturing process.

Also, in this case, the scan wiring lines 11a, the auxiliary capacitance wiring lines 11b, and the relay wiring lines 11c and 11d shown in FIG. 3 are simultaneously formed.

<Process of Forming Second Interlayer Insulating Film>

Next, on the entire substrate upon which the source electrode 16aa and the drain electrode 16b are formed (in other words, where the TFT 28 is formed), a silicon nitride film (approximately 3000 to 3500 Å in thickness), for example, is formed by CVD. Then, by performing patterning, exposure and developing, and removal and washing of the resist by photolithography using a photomask having a prescribed pattern for the silicon nitride film, as shown in FIG. 8, the second interlayer insulating layer 9b covering the first interlayer insulating layer 9a, the source electrode 16aa, and the drain electrode 16b is formed, and the interlayer insulating layer 9 covering the TFT 28 (in other words, covering the semiconductor layer 8, the source electrode 16aa, and the drain electrode 16b) is formed. The patterned second interlayer insulating layer 9b has formed therein the contact hole Ca mentioned above.

<Step of Forming Pixel Electrode>

Next, a transparent conductive film such as an ITO film (approximately 50 nm to 200 nm in thickness) made of indium tin oxide is formed, for example, by sputtering onto the entire substrate upon which the interlayer insulating layer 9 is formed. Then, patterning, exposure and developing, and removal and washing of the resist by photolithography using a photomask having a prescribed pattern for the transparent conductive film, the pixel electrode 19, the gate terminal 19b, the source terminal 19c, and the auxiliary capacitance terminal 19d (refer to FIG. 3) are formed.

In this manner, it is possible to form the thin film transistor substrate 20a shown in FIG. 3.

According to the present embodiment described above, the following effects can be attained in addition to the effects (1) to (4) described above.

(5) In the present embodiment, the third barrier metal layer 14 provided on the semiconductor layer 8 and made of a metal other than copper is provided at the source electrode 16aa and the drain electrode 16b. Thus, the third barrier metal layer 14 made of a metal other than copper is provided between the semiconductor layer 8 and the second copper layer 15, and therefore, it is possible to prevent the dispersion of copper from the source electrode 16aa and the drain electrode 16b to the semiconductor layer 8 constituting the TFT 28. Therefore, in the TFT 28, it is possible to further prevent the occurrence of leakage current resulting from the dispersion of copper to the semiconductor layer 8, and in the liquid crystal display device 50, it is possible to further prevent the occurrence of pixel defects and a decrease in display quality. Also, it is possible to further prevent a change in threshold voltage in the TFTs 28, and thus, it is possible to further prevent a decrease in TFT characteristics.

(6) In the present embodiment, the fourth barrier metal layer 17 made of a metal other than copper is provided on the second copper layer 15. Therefore, even if the amount of time taken for heat treatment is long in the manufacturing process and the distance of movement (dispersion) of the copper is large, it is possible to prevent the dispersion of copper to the semiconductor layer 8 through the interlayer insulating layer 9.

(7) In the present embodiment, in the step of forming the second copper layer, copper is deposited and filled into penetrating holes 9c using electroplating, and thus, the second copper layer 15 is formed on the third barrier metal layer 14. Therefore, it is possible to prevent patterning defects in the source electrode 16aa and the drain electrode 16b that would result from forming or etching the copper film.

The embodiments above may be modified in the following manner.

In the embodiments above, a silicon-based semiconductor layer is used as the semiconductor layer, but the semiconductor layer is not limited thereto. An oxide semiconductor layer made of indium gallium zinc oxide (IGZO) may be used as the semiconductor layer in the TFT 28, for example, instead of the silicon-based semiconductor layer.

First, as in FIG. 5 of Embodiment 1 above, the gate electrode 2 constituted of a layered member including the first barrier metal layer 3, the first copper layer 4, and the second barrier metal layer 5, and the planarizing film 6 are formed on the insulating substrate 10a.

Figure 10:
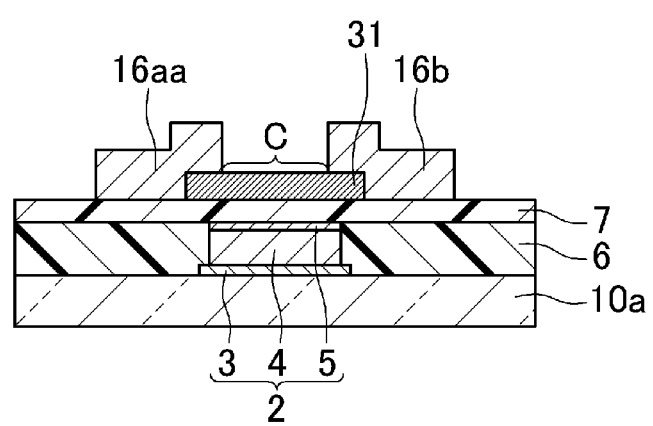
FIG. 10 is a cross-sectional view of a TFT portion of the thin film transistor substrate of a modification example of the present invention.

Then, as in Embodiment 1 above, the gate insulating layer 7 is formed on the surface of the gate electrode 2 and the planarizing film 6, and then, in the step of forming the semiconductor layer, an IGZO-type oxide semiconductor film (approximately 500 to 600 Å in thickness) is formed, for example, by plasma CVD on the entire substrate upon which the gate insulating layer 7 is formed. Then, by performing patterning, dry etching, and removal and washing of the resist by photolithography using a photomask, as shown in FIG. 10, the oxide semiconductor layer 31 is patterned.

Figure 11:
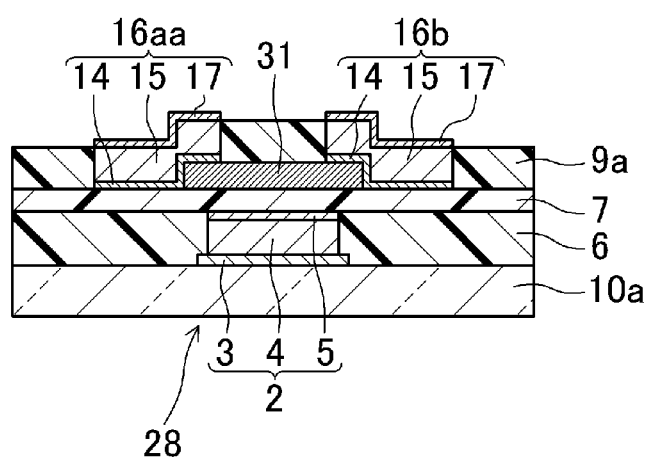
FIG. 11 includes descriptive drawings of cross-sections of manufacturing steps for the thin film transistor substrate of a modification example of the present invention.

Then, by performing steps similar to those of FIGS. 9(b) to 9(e) above, the TFT 28 shown in FIG. 11 is formed, and then, by performing the step of forming the second interlayer insulating layer, and the step of forming the pixel electrodes, the thin film transistor substrate 20a shown in FIGS. 2 and 3 is formed. Even with this configuration, effects similar to those of (1) to (7) above can be attained.

As the oxide semiconductor constituting the oxide semiconductor layer 31, indium gallium zinc oxide (IGZO), which can attain excellent characteristics such as high mobility and low OFF current in the TFT 28, was given as an example thereof, but the oxide semiconductor may be of an In—Si—Zn—O type, an In—Al—Zn—O type, an Sn—Si—Zn—O type, an Sn—Al—Zn—O type, an Sn—Ga—Zn—O type, a Ga—Si—Zn—O type, a Ga—Al—Zn—O type, an In—Cu—Zn—O type, an Sn—Cu—Zn—O type, a Zn—O type, an In—O type, or the like.

In other words, the oxide semiconductor layer 31 is not limited to an oxide semiconductor layer made of indium gallium zinc oxide (IGZO), and may be made of a material made of a metal oxide including at least one of indium (In), gallium (Ga), aluminum (Al), copper (Cu), zinc (Zn), manganese (Mg), and cadmium (Cd).

The oxide semiconductor layer 31 made of these materials has a high mobility even when amorphous, and thus, it is possible to increase the ON resistance of the switching element. Thus, the difference in output voltage when reading data becomes large, and the S/N ratio can be improved. Examples besides IGZO (In—Ga—Zn—O) include oxide semiconductor films such as $InGaO_3(ZnO)_5$, $Mg_XZn_{1-X}O$, $Cd_XZn_{1-X}O$, and CdO.

Also, in the embodiments above, a liquid crystal display device having a thin film transistor substrate was given as an example of a display device, but the present invention can also be applied to other display devices such as organic EL (electroluminescence) display devices, inorganic EL display devices, and electrophoretic display devices.

INDUSTRIAL APPLICABILITY

As described above, the present invention relates to a thin film transistor substrate and a method of manufacturing this, and in particular, is useful as a thin film transistor substrate having thin film transistors with electrodes made of copper, and a method of manufacturing this.

DESCRIPTION OF REFERENCE CHARACTERS 2 gate electrode
3 first barrier metal layer
4 first copper layer
5 second barrier metal layer
5a titanium film
6 planarizing film
6a penetrating hole
7 gate insulating layer
8 semiconductor layer
8a intrinsic amorphous silicon layer
8b amorphous silicon layer
9 interlayer insulating layer
9a first interlayer insulating layer
9b second interlayer insulating layer
9c penetrating hole (another penetrating hole)
10a insulating substrate
10b insulating substrate
11a scan wiring line
14 third barrier metal layer
15 second copper layer
16a signal wiring line
16aa source electrode
16b drain electrode
17 fourth barrier metal layer
17a titanium film
19 pixel electrode
20a thin film transistor substrate
23 common electrode
24 photospacer
28 TFT (thin film transistor)
30 opposite substrate
31 oxide semiconductor layer
40 liquid crystal layer
50 liquid crystal display device

The invention claimed is:

1. A thin film transistor substrate, comprising:
an insulating substrate;
a gate electrode formed on the insulating substrate and made of a layered member including a first barrier metal layer made of a metal or metal compound other than copper, a first copper layer provided on the first barrier metal layer, and a second barrier metal layer provided on the first copper layer and made of a metal or metal compound other than copper, a bottom surface of the first copper layer in contact with the first barrier metal layer being smaller than an entire top surface of the first barrier metal layer;
a gate insulating layer to cover the gate electrode; and
a semiconductor layer provided on the gate insulating layer and having a channel region overlapping the gate electrode.

2. The thin film transistor substrate according to claim 1, further comprising a source electrode and a drain electrode on the semiconductor layer respectively overlapping the gate electrode and facing each other across the channel region,
wherein the source electrode and the drain electrode are each made of a layered member including a third barrier metal layer provided on the semiconductor layer and made of a metal or metal compound other than copper, a second copper layer provided on the third barrier metal layer, and a fourth barrier metal layer provided on the second copper layer and made of a metal or metal compound other than copper.

3. The thin film transistor substrate according to claim 1, wherein the metal or metal compound other than copper in the first or second barrier metal layer is at least one of a group including titanium, tantalum, tantalum nitride, manganese, and tungsten.

4. The thin film transistor substrate according to claim 1, wherein the semiconductor layer is a silicon-type semiconductor layer.

5. The thin film transistor substrate according to claim 1, wherein the semiconductor layer is an oxide semiconductor layer.

6. The thin film transistor substrate according to claim 5, wherein the oxide semiconductor layer is made of a metal oxide including at least one of a group including indium, gallium, aluminum, copper, and zinc.

7. The thin film transistor substrate according to claim 6, wherein the oxide semiconductor layer is made of indium gallium zinc oxide.

8. A method of manufacturing a thin film transistor substrate, comprising at least:
forming, on an insulating substrate, a first barrier metal layer made of a metal or metal compound other than copper;
covering a periphery portion of the first barrier metal layer with a patterned insulting film;
electroplating copper onto a portion of a top surface of the first barrier metal layer that has been exposed by the patterned insulating film to form a first copper layer on the first barrier metal layer, thereby a bottom surface of the first copper layer in contact with the first barrier metal layer being smaller than an entire top surface of the first barrier metal layer;
forming, on the first copper layer, a second barrier metal layer made of a metal or metal compound other than copper, and thereby forming a gate electrode made of a layered member including the first barrier metal layer, the first copper layer, and the second barrier metal layer;
forming a gate insulating layer on the gate electrode; and
forming, on the gate insulating layer, a semiconductor layer having a channel region overlapping the gate electrode.

9. The method of manufacturing a thin film transistor substrate according to claim 8, further comprising:
forming, after the step of forming the semiconductor layer, a third barrier metal layer made of a metal or metal compound other than copper on the gate insulating layer and the semiconductor layer;
forming a second copper layer on the third barrier metal layer; and
forming a fourth barrier metal layer made of a metal or metal compound other than copper on the second copper layer, and thereby forming a source electrode and a drain electrode each made of a layered member including the third barrier metal layer, the second copper layer, and the fourth barrier metal layer, the source electrode and the drain electrode respectively overlapping the gate electrode and facing each other across the channel region.

10. The method of manufacturing a thin film transistor substrate according to claim 9, further comprising, after the step of forming the third barrier metal layer, forming an insulating layer having another penetrating hole over the third barrier metal layer on the gate insulating layer and the channel region of the semiconductor layer,
  wherein, in the step of forming the second copper layer, said another penetrating hole is filled with copper by electroplating, thereby forming the second copper layer on the third barrier metal layer.

11. The method of manufacturing a thin film transistor substrate according to claim 8, wherein the metal or metal compound other than copper in the first or second barrier metal layer is at least one of a group including titanium, tantalum, tantalum nitride, manganese, and tungsten.

* * * * *